United States Patent
Chatterjee et al.

(10) Patent No.: US 7,259,605 B2
(45) Date of Patent: Aug. 21, 2007

(54) PSEUDO TRUE SINGLE PHASE CLOCK LATCH WITH FEEDBACK MECHANISM

(75) Inventors: Kallol Chatterjee, Calcutta (IN); Jeet Narayan Tiwari, Gorakhpur (IN)

(73) Assignee: STMicroelectronics Pvt. Ltd., Uttar Pradesh (IN)

( * ) Notice: Subject to any disclaimer, the term of this patent is extended or adjusted under 35 U.S.C. 154(b) by 0 days.

(21) Appl. No.: 10/969,783

(22) Filed: Oct. 20, 2004

(65) Prior Publication Data

US 2006/0082405 A1    Apr. 20, 2006

(51) Int. Cl.
*H03K 3/356* (2006.01)

(52) U.S. Cl. ................. 327/210; 327/211; 327/212

(58) Field of Classification Search ........... 327/199, 327/200, 202, 203, 208, 210–212, 218
See application file for complete search history.

(56) References Cited

U.S. PATENT DOCUMENTS

| | | | |
|---|---|---|---|
| 4,733,111 A * | 3/1988 | Fassino et al. ........... 327/203 |
| 5,095,225 A * | 3/1992 | Usui ....................... 327/211 |
| 5,592,114 A * | 1/1997 | Wu et al. ................. 327/208 |
| 5,917,355 A * | 6/1999 | Klass ...................... 327/208 |
| 6,253,066 B1 * | 6/2001 | Wilhite et al. ........... 455/108 |
| 6,424,195 B2 * | 7/2002 | Samala .................... 327/211 |
| 6,504,412 B1 * | 1/2003 | Vangal et al. ............ 327/203 |
| 6,600,345 B1 * | 7/2003 | Boutaud .................. 327/99 |

* cited by examiner

*Primary Examiner*—Kenneth B. Wells
(74) *Attorney, Agent, or Firm*—Hogan & Hartson LLP

(57) ABSTRACT

A pseudo true single phase clock latch (pseudo "TSPC" latch) includes additional circuitry coupled to three previously floating nodes that can lose data depending upon the amount of leakage current associated with these nodes. The additional circuitry, including a positive feedback circuit, improves the performance of a true single phase clock latch circuit at lower frequencies without significant degradation in high frequency operation of the latch.

13 Claims, 6 Drawing Sheets

Figure 2 (TSPC-D Latch in Divide by 2 mode)

PRIOR ART

Figure 3 (Internal nodes of TSPC Latch)

PRIOR ART

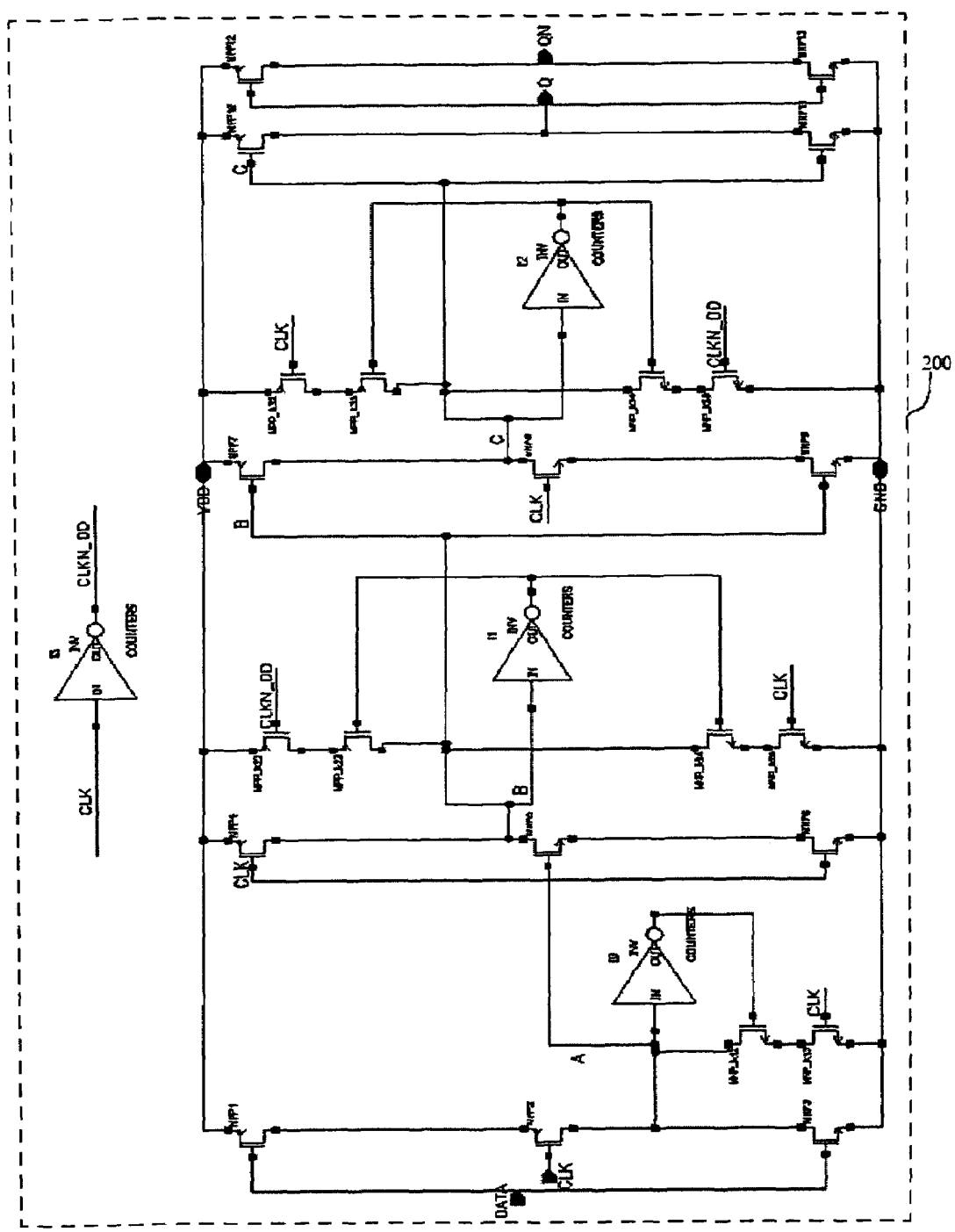
Figure 5 (Pseudo-TSPC latch)

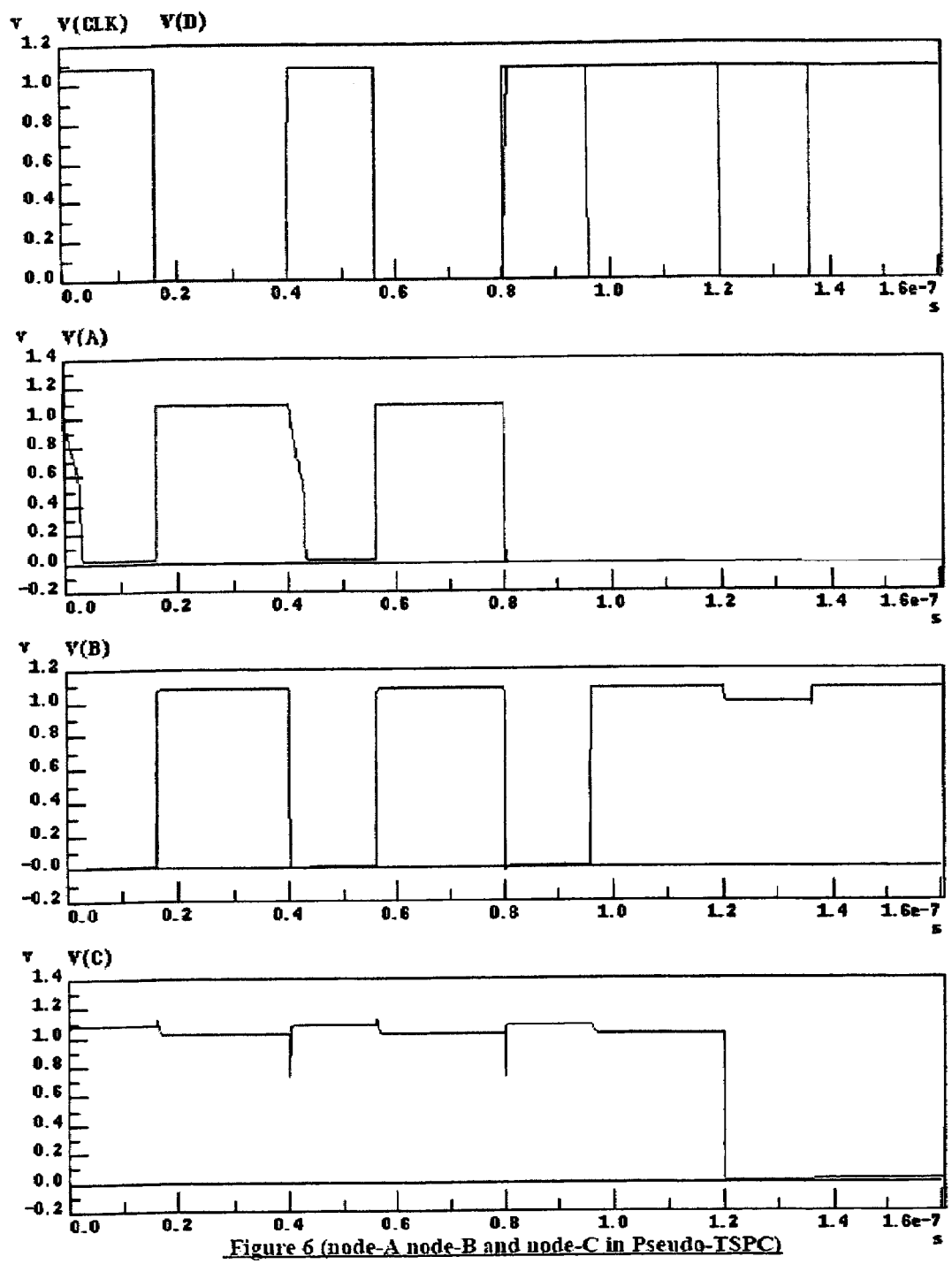
Figure 6 (node-A node-B and node-C in Pseudo-TSPC)

PSEUDO TRUE SINGLE PHASE CLOCK LATCH WITH FEEDBACK MECHANISM

FIELD OF THE INVENTION

This invention relates to a pseudo true single phase clock latch (pseudo "TSPC" latch).

DESCRIPTION OF THE RELATED ART

Counters are directly used in PLL loops where there is a large variation in VCO frequency. In the initial stage, VCO output frequency is very low so if the counters in the loop fail at these frequencies, they may cause functional failure of the PLL.

FIG. 1 shows the schematic of a TSPC D-latch. DATA is applied at the gates of transistors MP1 and MN3 while the input clock is applied at the gates of transistors MP2, MP4, MN6 and MN8. The output is obtained at terminals Q and QN.

The basic operation of a TSPC latch is as follows. When the input CLK is low, transistor MP2 is turned on. Node A thus contains a complemented value of DATA applied at the input. Node B pre-charges to high logic level and node C attains a floating state, as it is dependent upon its previous logic level.

If the logic level of DATA as well as CLK is low, then the node A is charged to a high logic level. With the rising edge of CLK, transistor MN6 turns on and discharges node B. Due to this, transistor MP7 turns on and causes node C to charge to a high logic level thereby generating output Q that is a low logic level.

If the logic level of applied DATA is high, transistor MN3 is turned on while transistor MP1 is turned off enabling node A to discharge, thereby turning off transistor MN5. Node B is charged to a high logic level. When CLK goes high, node B remains at a high logic level. Since CLK is high, the third stage of this TSPC latch becomes transparent and provides an inverted logic state of node B (high) at node C (low). As a result a high logic level is obtained at Q.

Although the abovementioned latch holds the logic values at high frequencies, at lower frequencies it fails to retain the values due to leakage current on these floating nodes. The leakage problem is illustrated as follows:

Case 1

When CLK and DATA are at a low logic level, nodes A and B pre-charge to a high logic level. When CLK goes high, node A goes to a floating state, as transistor MP2 as well as transistor MN3 are off. If the leakage current through transistor MN3 is more than the leakage current through transistors MP1 and MP2, node discharges slowly, resulting in voltage lower than the high voltage level. In this case, transistor MN5 turns off, resulting in floating node B. Node B may lose its logic state, if the leakage through transistor MP4 is more than the leakage through transistors MN5 and MN6. This may result in the turning on of the transistors MP7, MN9 and MN8 (since CLK is high) simultaneously, turning node C into a metastable state or an undesired logic state.

Case 2

If CLK is at a low logic level and DATA is at a high logic level, node A discharges to a low logic level, node B pre-charges to a high logic level, and node C floats as transistors MP7 and MN8 are off. Furthermore, no direct path from the supply voltage VDD to node C or node C to ground is available. Ideally, node C retains its previous state, but because of the leakage current through transistors MP7 and MN8, it may achieve a metastable state or an undesired logic state.

Case 3

If CLK and DATA are at high logic level, node A discharges to a low logic level turning transistors MP4 and MN5 off, thereby resulting in floating node B. The floating condition of this node may cause it to achieve a metastable state and this metastability may finally be reflected at node C.

Failure analysis of the TSPC latch is shown in FIG. 2 (in a divide by two condition, when node C is coupled to DATA) and FIG. 3 (DATA applied).

SUMMARY OF THE INVENTION

According to an embodiment of the present invention, additional circuitry substantially eliminates the problems described above. More specifically, an embodiment of the present invention is related to improvement in the low frequency operation of the TSPC latch, which should operate at higher frequency as well as much lower frequency at all process corners and temperatures. The additional circuitry, according to an embodiment of the present invention, does not substantially otherwise adversely affect circuit performance and makes nodes A, B, and C static.

To obviate the aforesaid drawbacks, an embodiment of the present invention provides a pseudo-TSPC latch that operates at higher as well as lower frequency at all process corners. An embodiment of the invention also provides stable nodes at low frequency clock signals.

An embodiment of the invention provides a pseudo true single phase clock latch comprising a positive feedback mechanism to stabilize the voltage level at an intermediate node.

The positive feedback mechanism of the present invention includes a series of switching elements coupled between the supply terminals and said intermediate node and an inverting element driven by said intermediate node with its output driving the control terminals of said switching elements.

The series of switching elements includes two PMOS/NMOS transistors coupled in series with each other.

The switching elements are coupled between the positive supply and said intermediate node and the negative supply and said intermediate node.

The switching elements are coupled between said the positive supply and said intermediate node or the negative supply and said intermediate node.

According to an embodiment of the present invention, a pseudo true single phase clock latch includes a first set of complementary transistor having their control terminals being driven by the data input and providing a first output node, a second set of complementary transistor having their control terminals being driven by the clock, said first node being coupled to the control terminal of NMOS transistor provided between said second set of complementary transistor and thereby providing a second output node, a third set of complementary transistor having their control terminals being driven by said second node and providing a third output node, an output section driven by said third node providing the final output, as well as a positive feedback mechanism coupled to said first, second and third output nodes to stabilize the voltage level at said first, second and third output nodes.

The first, second and third sets of complementary transistor include PMOS and NMOS transistors.

The positive feedback mechanism includes a series of switching elements coupled between the supply terminals and said intermediate node and an inverting element driven by said intermediate node with its output driving the control terminals of said switching elements.

A method for latching data in pseudo true single phase clock latch includes a positive feedback to enable a connection between the supply terminals and an intermediate node to provide a stable bias.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein:

FIG. 5 shows the additional circuitry of FIGS. 4(a), 4(b), and 4(c) merged into the schematic diagram of FIG. 1, according to an embodiment of the present invention; and FIG. 6 is a timing diagram of the internal waveforms of the pseudo TSPC D-type latch shown in FIG. 5, according to an embodiment of the present invention.

DETAILED DESCRIPTION OF THE INVENTION

Figure 4:
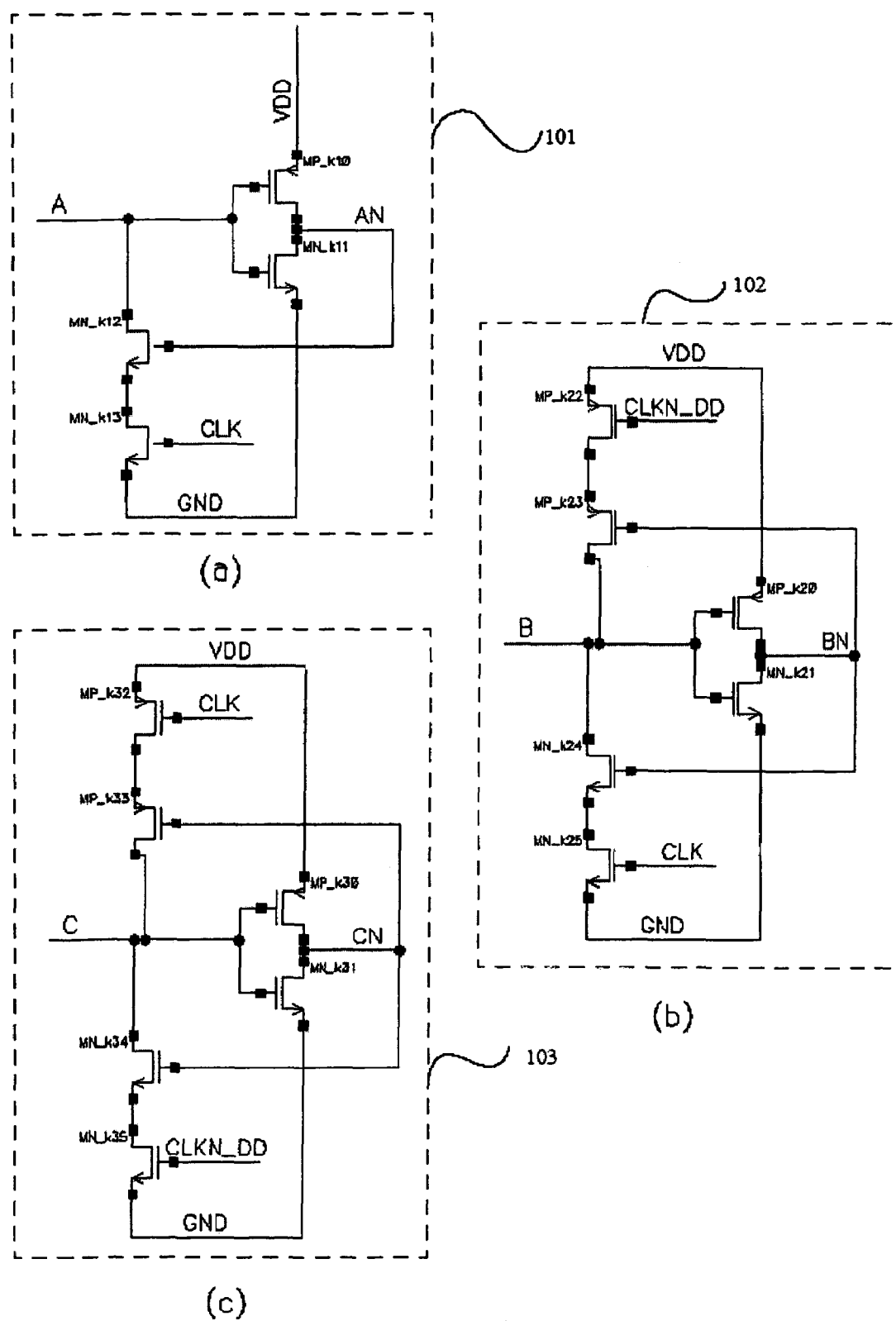
FIGS. 4(a), 4(b), and 4(c) are additional circuit blocks according to the present invention for coupling to nodes A, B, and C, respectively found in the prior art TSPC D-type latch.

FIGS. 4(a), 4(b) and 4(c) show additional circuitry coupled to nodes A, B and C respectively. Referring to FIG. 4(a), when CLK is at a high logic level, transistor Mn_k13 turns on. If node A is at a low logic level, node AN becomes high, which in turn switches on transistor MN_k12. Thus, node A remains at a low logic level because a direct path from node A to ground is formed. This feedback circuit ensures that the level is maintained in a stable state when node A is low in an evaluation period.

Referring to FIG. 4(b), the stabilization circuit for node B is shown. When CLK is high and node A is low, node-B goes high and node BN goes low. Since transistors MP_k23 and MP_k22 are both on when node-B and CLK is high, node B maintains a high logic level as it is directly connected to VDD. If node A is at a high logic level, node B discharges and it is low while CLK is high, turning on transistors MN_k24 and MN_k25. The feedback circuit at node B ensures that a stable state is maintained when CLK is high.

Figure 1:
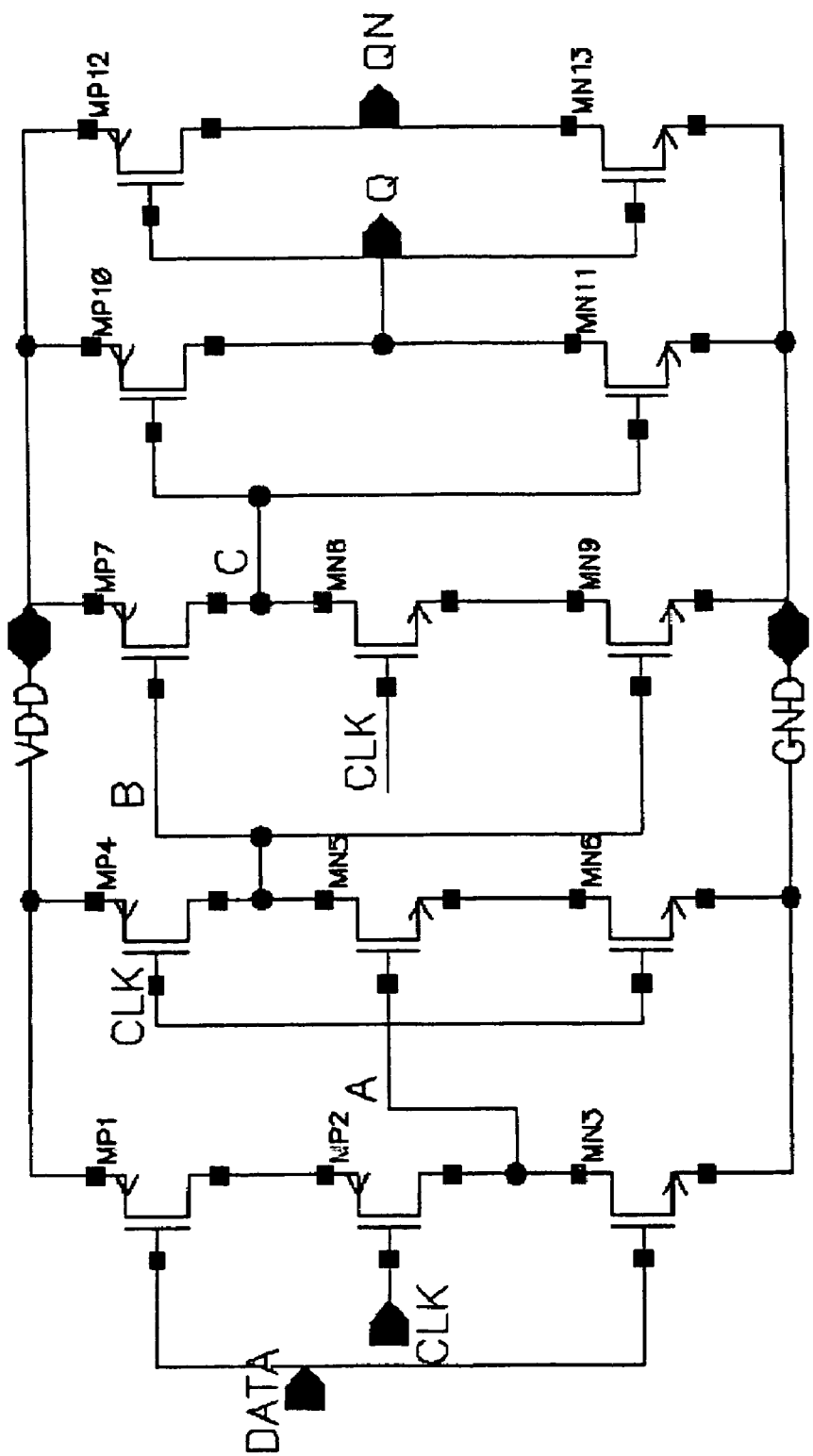
FIG. 1 is a detailed schematic of a prior art TSPC D-type latch.
Figure 2:
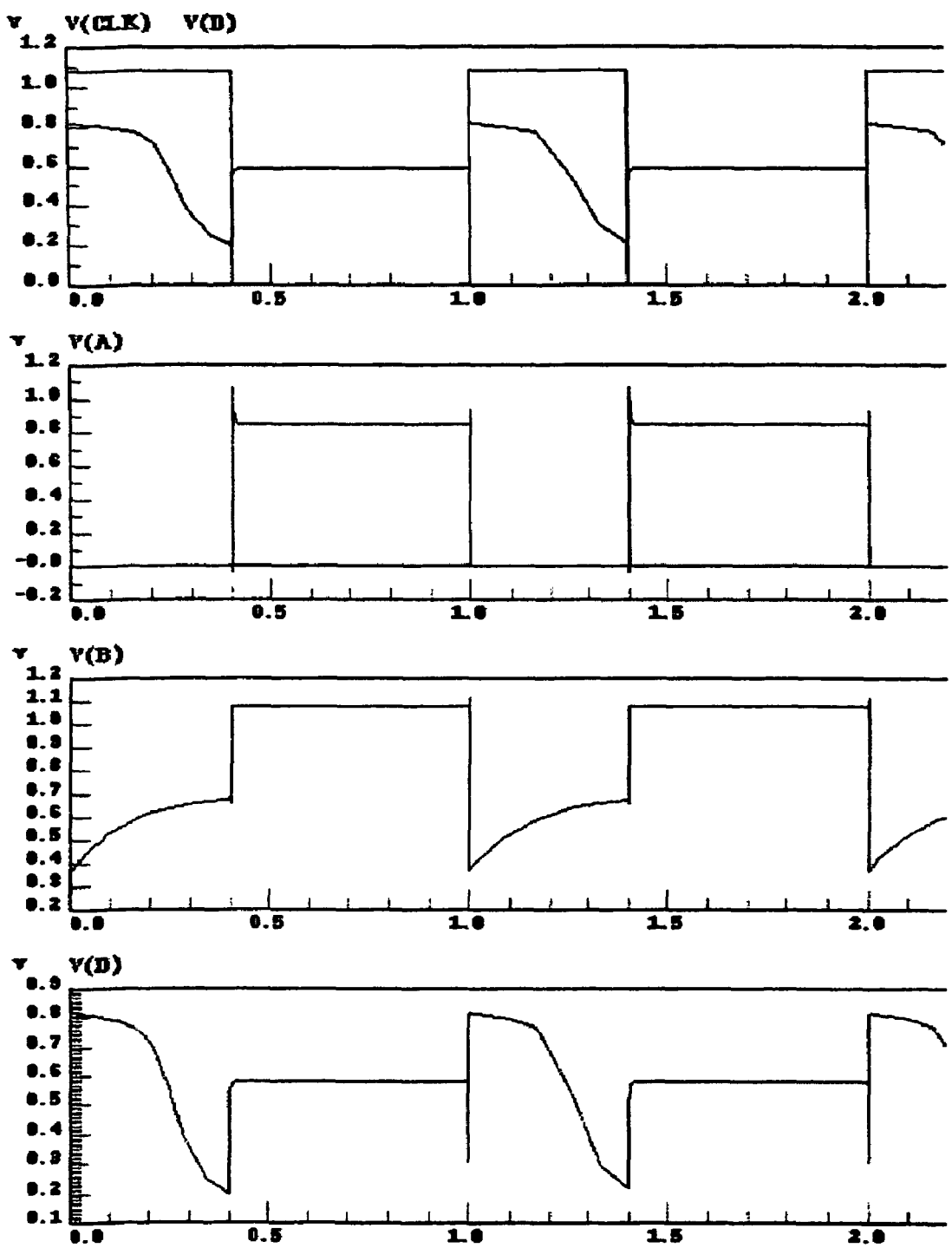
FIG. 2 is a timing diagram of the prior art TSPC D-type latch shown in FIG. 1 if a "divide by two" mode of operation.
Figure 3:
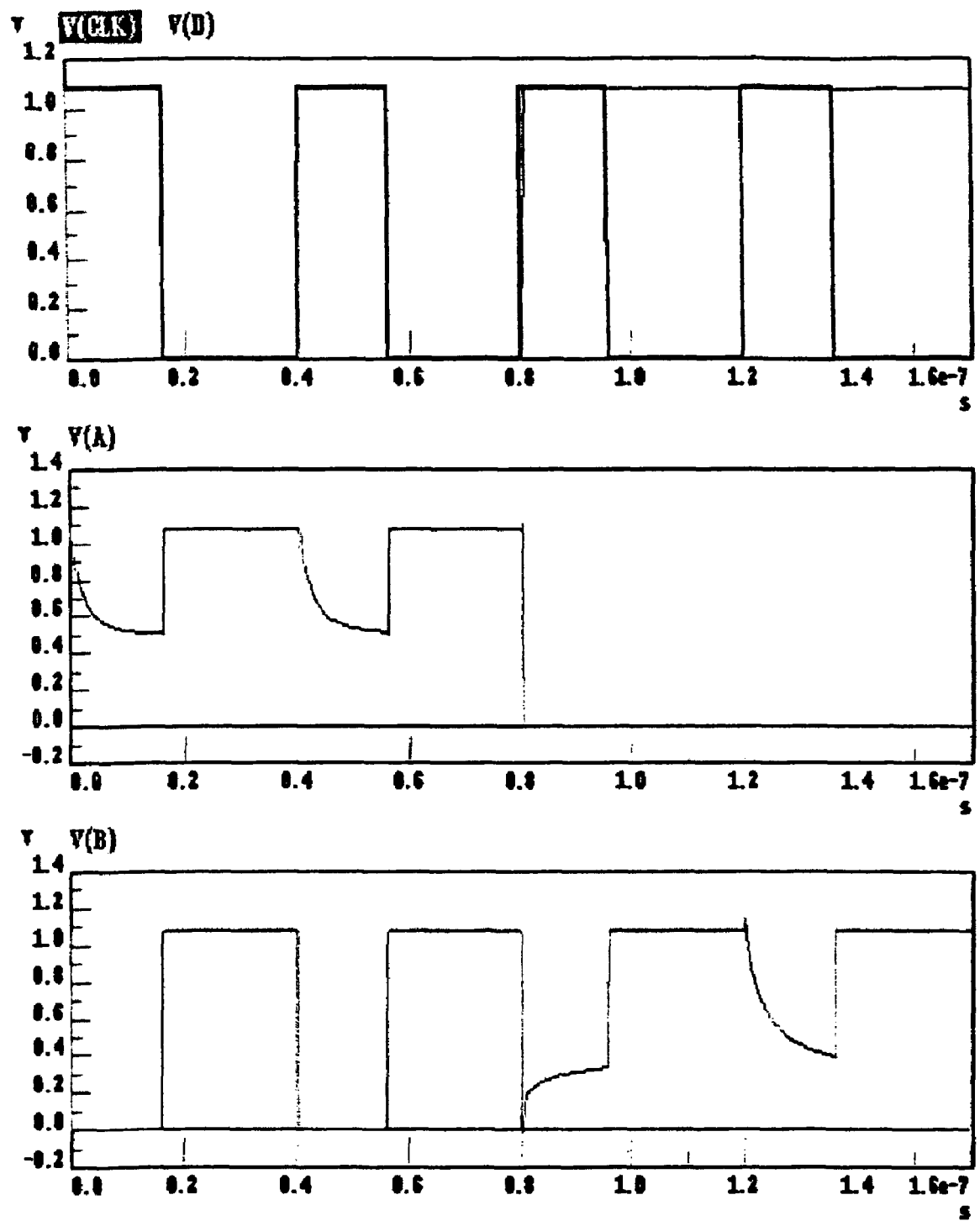
FIG. 3 is a timing diagram of the prior art TSPC D-type latch shown in FIG. 1 wherein the internal node waveforms are shown.

If node B is high when CLK goes high, node C is low. If node B is low when CLK goes high, node C is high. When CLK goes low, node C floated according to the previous TSPC latch shown in FIG. 1. By adding keeper circuits ("keepers") at node C in a manner shown in FIG. 4(c) node C remains at a low because node CN turns high, which turns on transistor MN_k34. Alternatively, node C remains high because node CN turns low, which turns on transistor MP_k33. Since CLK is low (so CLKN_DD is high) transistor MN_k35 (or, alternatively transistor MP_k32) is turned on. So the feedback circuit added at node C ensures that the node C maintains a stable state when CLK is low.

FIG. 5 shows the TSPC latch according to an embodiment of the present invention with keepers added at internal nodes A, B, C. At node-A, when the logic level changes from high to low logic level, transistor MNP5 turns off. Yet it does not affect the next stage hence no keepers are added at node A to make it high for given logic during an evaluation period of node A. It is desirable that the transistors of the keepers be of a very small size so that they do not substantially affect node capacitances and the maximum frequency of operation. The inverter used to invert the CLK should be weaker than inverter used to invert the node values. This is because the path of the keepers should be turned on at very low frequencies, and not at the time of evaluation of these nodes. Ignoring this causes a substantial increase in current consumption. For example, consider the case when the DATA input is low. When CLK is low, node A is high, node B pre-charges to a high level and node C remains at its previous state. When CLK goes high, node B discharges to ground. Accordingly, node BN goes from low to high. So, in the feedback circuit shown in FIG. 4(b) it is highly desirable to turn off transistor MP_k23 before turning on transistor MP_k22 because of CLKN_DD going low. Ignoring of this causes a direct path from supply to ground through the transistors MP_k22, MP_k23, MNP5, and MNP6 and increases power consumption.

FIG. 6 is a timing diagram of the internal waveforms A, B, and C, as well the CLK signal, of the pseudo TSPC D-type latch shown in FIG. 5, according to an embodiment of the present invention.

The pseudo TSPC latch according to the present invention and the prior art TSPC latch have been simulated at all possible process-corners, voltages and temperature ranges with a 10 fF output load at the Q and QN nodes for comparison analysis in a 0.13 micron technology. The pseudo-TSPC latch has been checked for Fmin, which comes out to be 1 Hz compared to that of the TSPC, which fails at a 10 MHz input clock frequency. Variations in maximum frequency of operation for two different process corners are given in the Table-1. It can be seen from the table that the maximum frequency of operation degrades by 10% in the pseudo-TSPC latch according to an embodiment of the present invention as compared to that of TSPC latch.

TABLE 1

Comparison Analysis of Pseudo TSPC with TSPC Latch

| | Rise/Fall time of Input CLK with 50% duty cycle (ps) | Maximum Frequency of operation for TSPC (GHz) | Maximum Frequency of operation for Pseudo TSPC (GHz) |
| --- | --- | --- | --- |
| case-1 | 60 | 6.75 | 6.05 |
| case-2 | 50 | 8.35 | 7.55 |

While there have been described above the principles of the present invention with respect to a preferred embodiment thereof, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

We claim:

1. A pseudo true single phase clock latch comprising:
   a first set of complementary transistors having their control terminals being driven by a data input and providing a first output node;
   a second set of complementary transistors having their control terminals being driven by a clock, said first output node being coupled to the control terminal of an NMOS transistor provided between said second set of complementary transistors and thereby providing a second output node;
   a third set of complementary transistors having their control terminals being driven by said second node and providing a third output node;
   an output section driven by said third node providing a final output; and
   a positive feedback circuit coupled to said first, second and third output nodes to stabilize the voltage level at said first, second and third output nodes.

2. A pseudo true single phase clock latch as in claim 1 wherein said first, second and third sets of complementary transistor comprise PMOS and NMOS transistors.

3. A pseudo true single phase clock latch as in claim 1 wherein said positive feedback circuit comprises:
   a series of switching elements coupled between a supply terminal and said intermediate node; and
   an inverting element driven by said intermediate node having an output for driving control terminals of said switching elements.

4. A pseudo true single phase clock latch comprising:
   a first clocked inverter having an input for receiving a data signal and an output coupled to a first intermediate node;
   a second clocked inverter having an input coupled to the first intermediate node and an output coupled to a second intermediate node;
   a third clocked inverter having an input coupled to the second intermediate node and an output coupled to a third intermediate node;
   an output section having an input coupled to the third intermediate node and an output for providing an output signal; and
   first, second, and third independent positive feedback circuits, wherein
   the first positive feedback circuit is coupled to and stabilizes the first intermediate node;
   the second positive feedback circuit is coupled to and stabilizes the second intermediate node; and
   the third positive feedback circuit is coupled to and stabilizes the third intermediate node;
   wherein the first positive feedback circuit comprises:
   an inverter having an input coupled to the first intermediate node; and
   first and second switching elements coupled between the first intermediate node and a negative power supply, wherein the first switching element is controlled by an output of the inverter, and the second switching element is controlled by a clock signal.

5. The pseudo true single phase clock latch as in claim 4 further comprising an additional output section for providing an inverted output signal.

6. A pseudo true single phase clock latch comprising:
   a first clocked inverter having an input for receiving a data signal and an output coupled to a first intermediate node;
   a second clocked inverter having an input coupled to the first intermediate node and an output coupled to a second intermediate node;
   a third clocked inverter having an input coupled to the second intermediate node and an output coupled to a third intermediate node;
   an output section having an input coupled to the third intermediate node and an output for providing an output signal; and
   first, second, and third independent positive feedback circuits, wherein
   the first positive feedback circuit is coupled to and stabilizes the first intermediate node;
   the second positive feedback circuit is coupled to and stabilizes the second intermediate node; and
   the third positive feedback circuit is coupled to and stabilizes the third intermediate node,
   wherein the second positive feedback circuit comprises:
   an inverter having an input coupled to the second intermediate node; and
   first and second switching elements coupled between the second intermediate node and a negative power supply, wherein the first switching element is controlled by an output of the inverter, and the second switching element is controlled by a clock signal.

7. The pseudo true single phase clock latch as in claim 6 further comprising an additional output section for providing an inverted output signal.

8. A pseudo true single phase clock latch comprising:
   a first clocked inverter having an input for receiving a data signal and an output coupled to a first intermediate node;
   a second clocked inverter having an input coupled to the first intermediate node and an output coupled to a second intermediate node;
   a third clocked inverter having an input coupled to the second intermediate node and an output coupled to a third intermediate node;
   an output section having an input coupled to the third intermediate node and an output for providing an output signal; and
   first, second, and third independent positive feedback circuits, wherein
   the first positive feedback circuit is coupled to and stabilizes the first intermediate node;
   the second positive feedback circuit is coupled to and stabilizes the second intermediate node; and
   the third positive feedback circuit is coupled to and stabilizes the third intermediate node,
   wherein the second positive feedback circuit comprises:
   an inverter having an input coupled to the second intermediate node; and
   first and second switching elements coupled between the first intermediate node and a positive power supply, wherein the first switching element is controlled by an output of the inverter, and the second switching element is controlled by a clock signal.

9. The pseudo true single phase clock latch as in claim 8 further comprising an additional output section for providing an inverted output signal.

10. A pseudo true single phase clock latch comprising:
a first clocked inverter having an input for receiving a data signal and an output coupled to a first intermediate node;
a second clocked inverter having an input coupled to the first intermediate node and an output coupled to a second intermediate node;
a third clocked inverter having an input coupled to the second intermediate node and an output coupled to a third intermediate node;
an output section having an input coupled to the third intermediate node and an output for providing an output signal; and
first, second, and third independent positive feedback circuits, wherein
the first positive feedback circuit is coupled to and stabilizes the first intermediate node;
the second positive feedback circuit is coupled to and stabilizes the second intermediate node; and
the third positive feedback circuit is coupled to and stabilizes the third intermediate node,
wherein the third positive feedback circuit comprises:
an inverter having an input coupled to the third intermediate node; and
first and second switching elements coupled between the third intermediate node and a negative power supply, wherein the first switching element is controlled by an output of the inverter, and the second switching element is controlled by a clock signal.

11. The pseudo true single phase clock latch as in claim 10 further comprising an additional output section for providing an inverted output signal.

12. A pseudo true single phase clock latch comprising:
a first clocked inverter having an input for receiving a data signal and an output coupled to a first intermediate node;
a second clocked inverter having an input coupled to the first intermediate node and an output coupled to a second intermediate node;
a third clocked inverter having an input coupled to the second intermediate node and an output coupled to a third intermediate node;
an output section having an input coupled to the third intermediate node and an output for providing an output signal; and
first, second, and third independent positive feedback circuits, wherein
the first positive feedback circuit is coupled to and stabilizes the first intermediate node;
the second positive feedback circuit is coupled to and stabilizes the second intermediate node; and
the third positive feedback circuit is coupled to and stabilizes the third intermediate,
wherein the third positive feedback circuit comprises:
an inverter having an input coupled to the third intermediate node; and
first and second switching elements coupled between the third intermediate node and a positive power supply, wherein the first switching element is controlled by an output of the inverter, and the second switching element is controlled by a clock signal.

13. The pseudo true single phase clock latch as in claim 12 further comprising an additional output section for providing an inverted output signal.

* * * * *